US009842811B1

(12) United States Patent
Chou

(10) Patent No.: US 9,842,811 B1
(45) Date of Patent: Dec. 12, 2017

(54) HEAT-DISSIPATING SEMICONDUCTOR PACKAGE FOR LESSENING PACKAGE WARPAGE

(71) Applicant: POWERTECH TECHNOLOGY INC., Hsinchu County (TW)

(72) Inventor: Chia-Jen Chou, Hsinchu County (TW)

(73) Assignee: POWERTECH TECHNOLOGY INC., Hsinchu County (TW)

( * ) Notice: Subject to any disclaimer, the term of this patent is extended or adjusted under 35 U.S.C. 154(b) by 0 days.

(21) Appl. No.: 15/355,011

(22) Filed: Nov. 17, 2016

(30) Foreign Application Priority Data

Jun. 8, 2016 (TW) .............................. 105118191 A

(51) Int. Cl.
| | | |
|---|---|---|
| *H01L 23/12* | (2006.01) | |
| *H01L 23/00* | (2006.01) | |
| *H01L 23/31* | (2006.01) | |
| *H01L 23/367* | (2006.01) | |
| *H01L 23/373* | (2006.01) | |
| *H01L 23/29* | (2006.01) | |
| *H01L 23/498* | (2006.01) | |

(52) U.S. Cl.
CPC .......... *H01L 23/562* (2013.01); *H01L 23/293* (2013.01); *H01L 23/3135* (2013.01); *H01L 23/3672* (2013.01); *H01L 23/3736* (2013.01); *H01L 23/3737* (2013.01); *H01L 23/49816* (2013.01); *H01L 23/49822* (2013.01); *H01L 23/49827* (2013.01); *H01L 24/48* (2013.01); *H01L 2224/48227* (2013.01)

(58) Field of Classification Search
CPC ......................... H01L 23/3677; H01L 23/3128
See application file for complete search history.

(56) References Cited

U.S. PATENT DOCUMENTS

2013/0249074 A1* 9/2013 Lee ........................ H05K 7/20
257/713

* cited by examiner

*Primary Examiner* — Samuel Gebremariam
(74) *Attorney, Agent, or Firm* — Winston Hsu

(57) ABSTRACT

A heat-dissipating semiconductor package includes a substrate, a chip, a first encapsulation body, a second encapsulation body and a heat sink. The substrate has an inner surface. The chip is disposed on the inner surface of the substrate. The first encapsulation body is formed on the inner surface of the substrate and encapsulates the chip. The second encapsulation body is formed on the first encapsulation body and a periphery area of the inner surface to encapsulate sidewalls and a top surface of the first encapsulation body and cover the periphery area of the inner surface. Wherein, the Young's modulus of the second encapsulation body is less than the Young's modulus of the first encapsulation body. The heat sink is attached to the second encapsulation body. Thereby, the design of the heat-dissipating semiconductor package utilizes multiple encapsulation bodies to reduce the package warpage after installing the heat sink.

20 Claims, 8 Drawing Sheets

US 9,842,811 B1

HEAT-DISSIPATING SEMICONDUCTOR PACKAGE FOR LESSENING PACKAGE WARPAGE

BACKGROUND OF THE INVENTION

1. Field of the Invention

The present invention relates to a semiconductor package, and more specifically, to a structure of heat-dissipating semiconductor package for reducing package warpage.

2. Description of the Prior Art

In the field of the semiconductor package, in order to protect the semiconductor chips, the insulating material, such as the molding encapsulation body, would be formed around the chips for encapsulating the chips. Referring to FIG. 1, a conventional semiconductor package 100 includes a substrate 110, a chip 120, an encapsulation body 130, a chip adhesion layer 160 and a plurality of solder balls 170. The substrate 110 has an inner surface 111. The chip 120 is disposed on the inner surface 111 of the substrate 110 and a plurality of solder wires 122 are utilized for electrically connecting the chip 120 and the substrate 110. The encapsulation body 130 is formed on the inner surface 111 of the substrate 110. When the semiconductor package 100 works in the operation of high frequency and high efficiency, the chip 120 of the semiconductor package 100 would generate heat. Referring to FIG. 2, in the condition that the size of the substrate 110 is 12 cm×12 cm, the package warpage of the semiconductor package 100 is approximate +20 μm when the thermal expansion coefficients of all the package devices of the semiconductor package 100 reach equilibrium.

In order to improve the efficiency of heat dissipation, installing a heat sink at the semiconductor package is proposed. Referring to FIG. 3, a conventional heat-dissipating semiconductor package 200 includes not only the aforementioned semiconductor package 100, but also a heat sink 250 with good heat-dissipating metal material such as copper. The heat sink 250 is adhered to the top surface 131 of the encapsulation body 130 through an adhesive layer 251. Besides the influence of the thermal expansion coefficients of the primary package devices, the thermal expansion coefficient of the heat sink 250 also influences the package warpage of the heat-dissipating semiconductor package 200. This is because the mismatch between the thermal expansion coefficient of the heat sink 250 and the thermal expansion coefficients of the other package devices of the heat-dissipating semiconductor package 200 is more significant, and therefore the thermal stress is generated between the heat sink 250 and the encapsulation body 130, such that serious package warpage would occur at the heat-dissipating semiconductor package 200. Referring to FIG. 4, when the thermal expansion coefficients of the primary package devices (such as the semiconductor package 100 shown in FIG. 1) of the heat-dissipating semiconductor package 200 reach equilibrium, the package warpage of the heat-dissipating semiconductor package 200 further installed with the heat sink 250 would be changed to −89 μm.

Therefore, after installing the heat sink at the semiconductor package, the problem of mismatch between the thermal expansion coefficients is more significant. Further, when the size of the heat sink is bigger, the thermal stress between the periphery of the heat sink and the periphery of the encapsulation body is greater, which results in that the package warpage of the semiconductor package is such serious that the solder balls connecting problem is caused. Thus, when installing any kind of heat sink at the semiconductor package, the thermal expansion coefficients of all the package devices of the semiconductor package need to be adjusted over and over again.

SUMMARY OF THE INVENTION

One of the objectives of the present invention discloses a heat-dissipating semiconductor package for reducing package warpage. The heat-dissipating semiconductor package includes a substrate, a chip, a first encapsulation body, a second encapsulation body and a heat sink. The substrate has an inner surface. The chip is disposed on the inner surface of the substrate. The first encapsulation body is formed on the inner surface of the substrate. The first encapsulation body encapsulates the chip and covers a portion of the inner surface of the substrate. The first encapsulation body has a top surface and a plurality of sidewalls. The second encapsulation body is formed on the first encapsulation body and a periphery area of the inner surface to encapsulate the sidewalls and the top surface of the first encapsulation body and cover the periphery area of the inner surface, wherein a Young's modulus of the second encapsulation body is less than a Young's modulus of the first encapsulation body. The heat sink is attached to the second encapsulation body.

These and other objectives of the present invention will no doubt become obvious to those of ordinary skill in the art after reading the following detailed description of the preferred embodiment that is illustrated in the various figures and drawings.

DETAILED DESCRIPTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, or the actual ratio. Some of the dimensions or dimension ratios have been enlarged or simplified to provide a better illustration. The actual numbers, actual shapes, or actual dimension ratios can be selectively designed and disposed and the detail component layouts may be more complicated.

Figure 5:
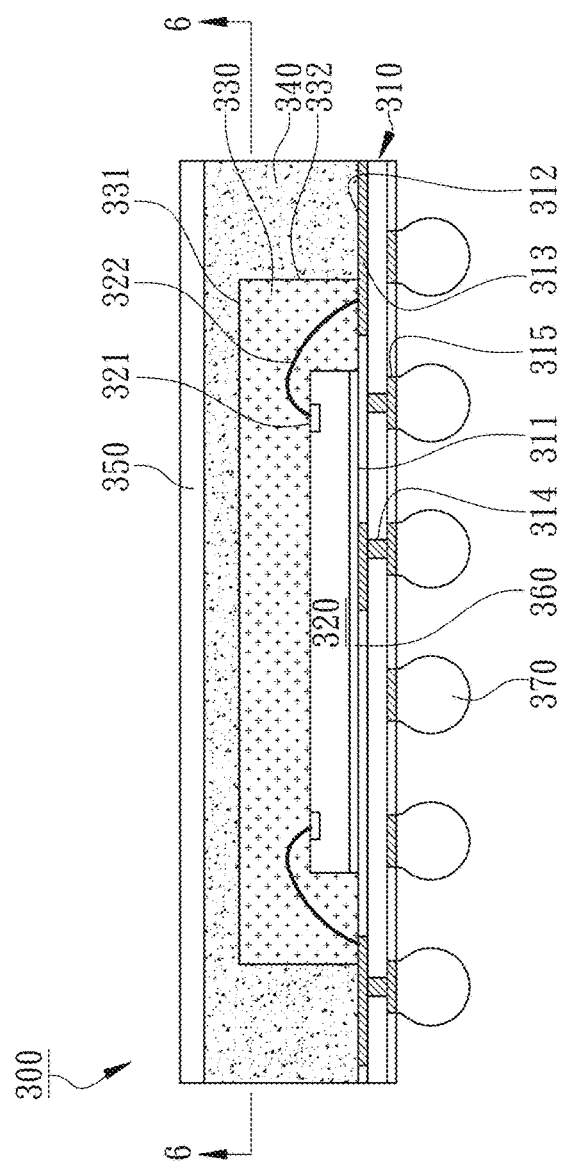
FIG. 5 is a cross sectional view diagram illustrating a heat-dissipating semiconductor package for reducing package warpage according to an embodiment of the present invention.
Figure 6:
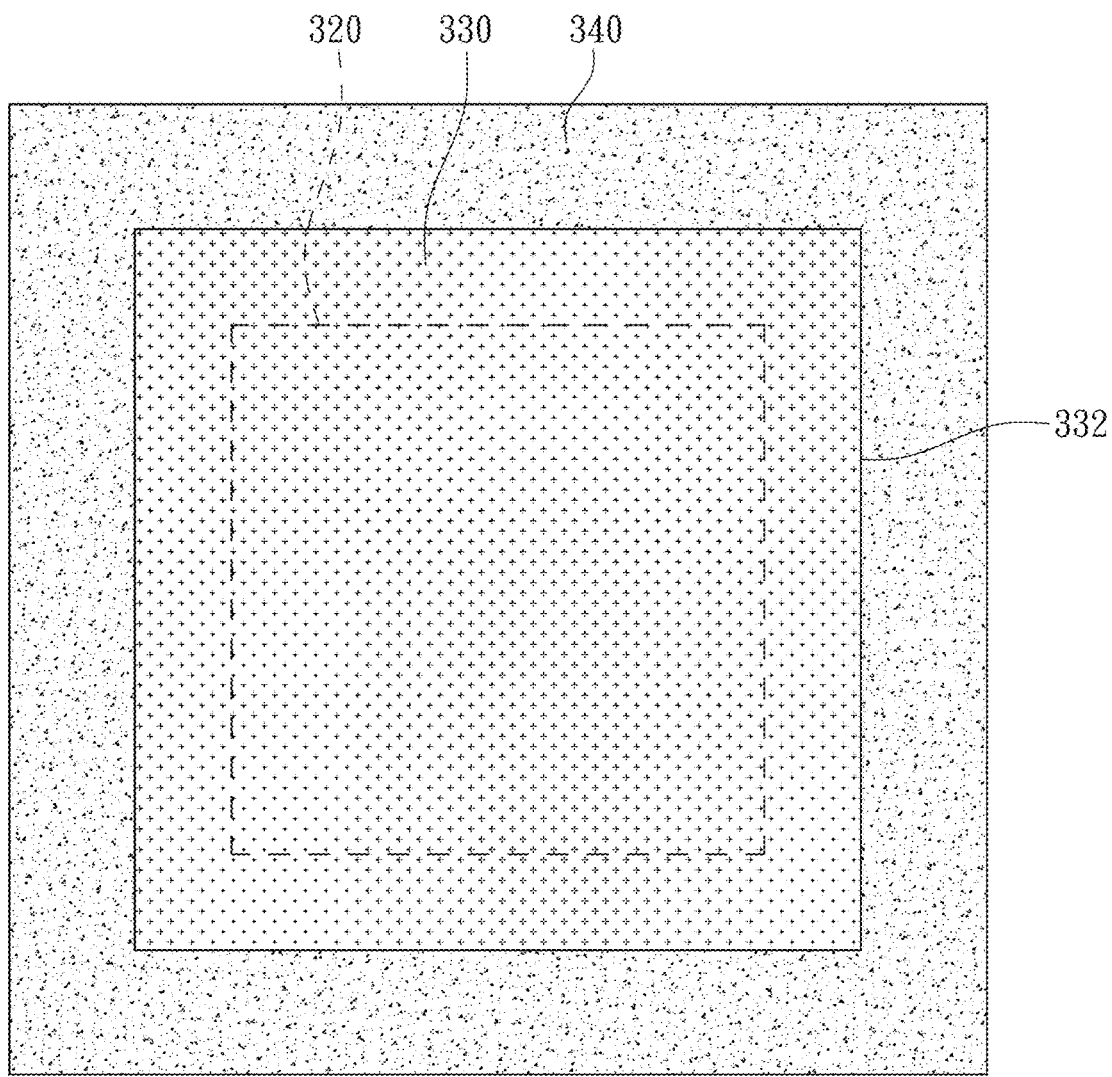
FIG. 6 is a cross sectional view diagram taken along the cross-sectional line 6-6 shown in FIG. 5.
Figure 7:
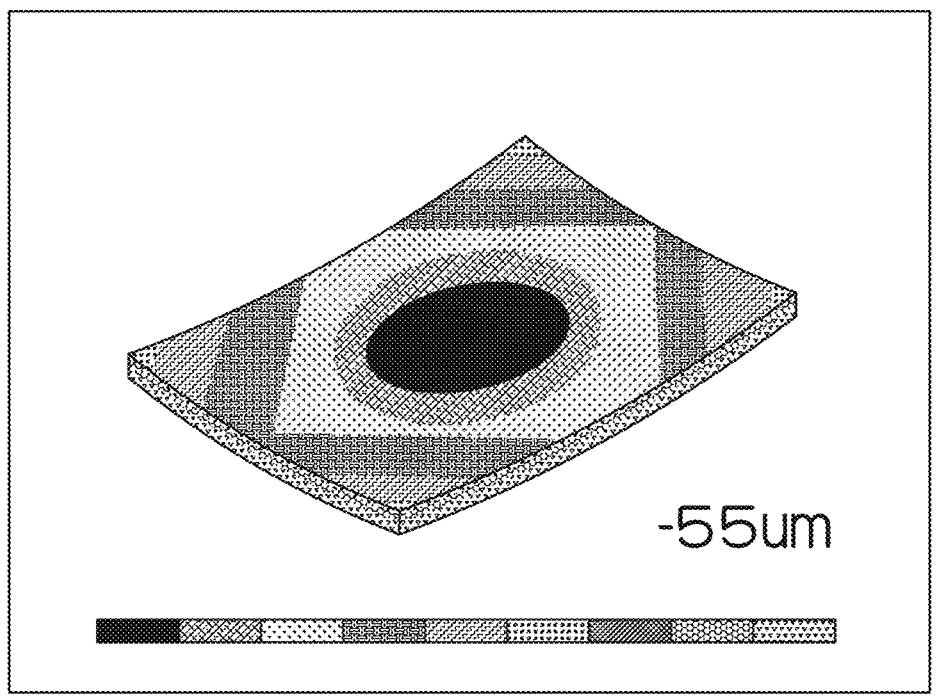
FIG. 7 is a schematic diagram illustrating package warpage of the heat-dissipating semiconductor package according to the embodiment of the present invention.

According to an embodiment of the present invention, a heat-dissipating semiconductor package 300 for reducing package warpage is illustrated in a cross sectional view diagram of FIG. 5. A heat-dissipating semiconductor package 300 for reducing package warpage includes a substrate 310, a chip 320, a first encapsulation body 330, a second encapsulation body 340 and a heat sink 350. FIG. 6 is a cross sectional view diagram taken along the cross-sectional line 6-6 shown in FIG. 5. FIG. 7 is a schematic diagram illustrating package warpage of the heat-dissipating semiconductor package 300 according to the embodiment of the present invention.

Referring to FIG. 5, the substrate 310 has an inner surface 311 serving as an installation surface of the chip. The substrate 310 is a package carrier board utilized for supporting the chip 320 and having transmission path(s) electrically connected to the chip 320. The substrate 310 includes a plurality of wiring lines 313 disposed on the inner surface 311, a plurality of through holes 314 utilized for vertical electrical-conduction and a plurality of bonding pads 315 disposed on an outer surface of the substrate 310. A portion of the wiring lines 313 are electrically connected to the corresponding bonding pads 315 via the through holes 314. The heat-dissipating semiconductor package 300 may further include a plurality of solder balls 370 disposed on the outer surface of the substrate 310. The solder balls 370 may be coupled with the bonding pads 315, and thus the solder balls 370 have a function of providing electrical connection to external. The heat-dissipating semiconductor package 300 may be a type of ball grid array (BGA) package.

The chip 320 is disposed on the inner surface 311 of the substrate 310. The chip 320 may be a semiconductor chip having an integrated circuit and has a plurality of solder pads 321. Each solder pad 321 corresponds to a solder wire 322 and is electrically connected to the wiring line(s) 313 of the substrate 310. The heat-dissipating semiconductor package 300 may further include a chip adhesion layer 360 disposed between the substrate 310 and the chip 320 for attaching the chip 320 to the substrate 310.

The first encapsulation body 330 is formed on the inner surface 311 of the substrate 310. The first encapsulation body 330 encapsulates the chip 320 and covers a portion of the inner surface 311 of the substrate 310. The first encapsulation body 330 may not cover a periphery area 312 of the inner surface 311 of the substrate 310. The first encapsulation body 330 has a top surface 331 and a plurality of sidewalls 332. The first encapsulation body 330 is an epoxy molding compound (EMC) formed on the substrate 310 through a molding formation process. The wiring lines 313 of the substrate 310 further extend to the periphery area 312. The wiring lines 313 extend over the covered area of the first encapsulation body 330 on the substrate 310. The second encapsulation body 340 is added to the package to improve the resistance of the package to warpage.

The second encapsulation body 340 is formed on the top surface 331 of the first encapsulation body 330 to encapsulate the sidewalls 332 of the first encapsulation body 330. The second encapsulation body 340 may further extend over the first encapsulation body 330 to cover the periphery area 312 of the substrate 310 to encapsulate the first encapsulation body 330 completely. Accordingly, the first encapsulation body 330 is not exposed from the outside of the heat-dissipating semiconductor package 300. The Young's modulus of the second encapsulation body 340 is less than the Young's modulus of the first encapsulation body 330. The material of the second encapsulation body 340 may provide a function of adhesion. In an exemplary embodiment, the value of the Young's modulus of the first encapsulation body 330 is three or more times the value of the Young's modulus of the second encapsulation body 340.

The second encapsulation body 340 serves as a warpage buffer layer between the top surface 331 of the first encapsulation body 330 and the heat sink 350. The thickness of the warpage buffer layer ranges from 0.05 mm to 0.2 mm. Thus the warpage of the heat sink 350 may not directly affect the first encapsulation body 330. The thickness of the heat sink 350 may range from 0.05 mm to 0.3 mm. The second encapsulation body 340 may be a flexible buffer disposed between the heat sink 350 and the first encapsulation body 330 and therefore the second encapsulation body 340 is used to improve the resistance to the influence of thermal stress caused by the difference between the thermal expansion coefficients of the heat sink 350 and the first encapsulation body 330. The second encapsulation body 340 can absorb and accommodate the deformation of the heat sink 350 to further reduce the package warpage. The thickness of the portion of the second encapsulation body 340 corresponding to and adjacent to the sidewalls 332 of the first encapsulation body 330 may range from 0.2 mm to 1.0 mm. Thus, the second encapsulation body 340 can encapsulate the top surface 331 and the sidewalls 332 of the first encapsulation body 330 tightly. Referring to FIG. 6, the second encapsulation body 340 surrounds the periphery of the first encapsulation body 330, and the inner surface 311 of the substrate 310 does not have any region exposed outside the second encapsulation body 340. The second encapsulation body 340 may serve as a carrier board disposed between the first encapsulation body 330 and the heat sink 350. Thus, the thickness of the second encapsulation body 340 may not be limited.

An elastic material would generate a normal strain when the elastic material suffers a normal stress. When the elastic deformation of the elastic material does not exceed the elastic limit of the elastic material, the ratio of the normal stress to the normal strain is defined as the Young's modulus of this material. The formula of the Young's modulus is written as $E=\sigma/\epsilon$. In the formula of the Young's modulus, "E" represents the Young's modulus, "$\sigma$" represents the normal stress, and "$\epsilon$" represents the normal strain. In this embodiment, the second encapsulation body 340 is utilized for adhering to the metal and covering the conventional encapsulation body. The material of the second encapsulation body 340 may include the adhesion glue material having low Young's modulus that may range from 0.01 GPa to 5 GPa. The material of the second encapsulation body 340 may, for example, be epoxy resin, silicon resin or polyimide resin. In some embodiments, the material of the second encapsulation body 340 may further include high thermal conductive material as additives utilized for improving thermal conductive ability, such as metal particles including aluminum, gold, or copper, metal alloy particles, or ceramic particles.

Figure 1:
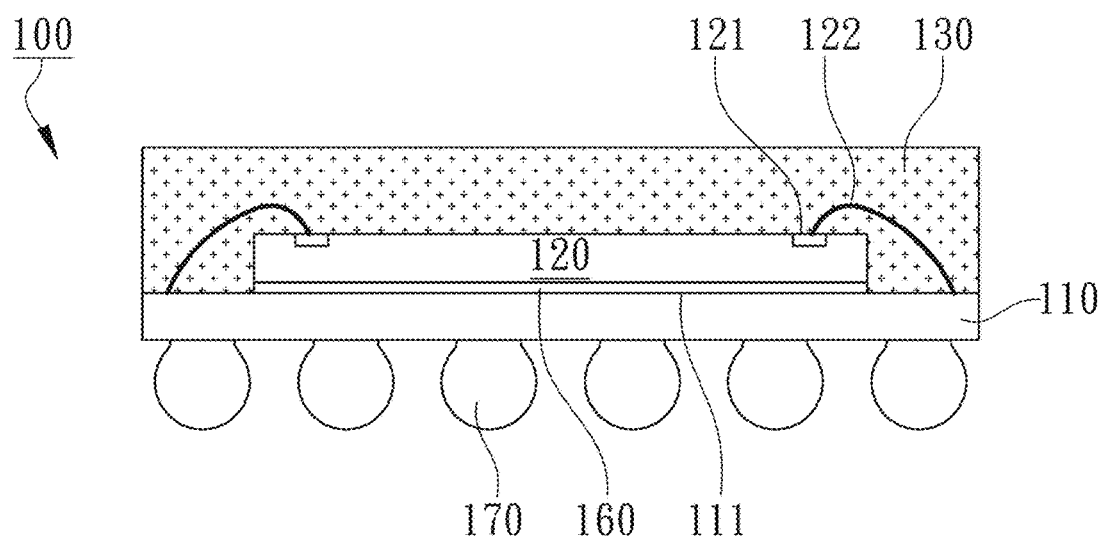
FIG. 1 is a cross sectional view diagram illustrating a conventional semiconductor package.
Figure 2:
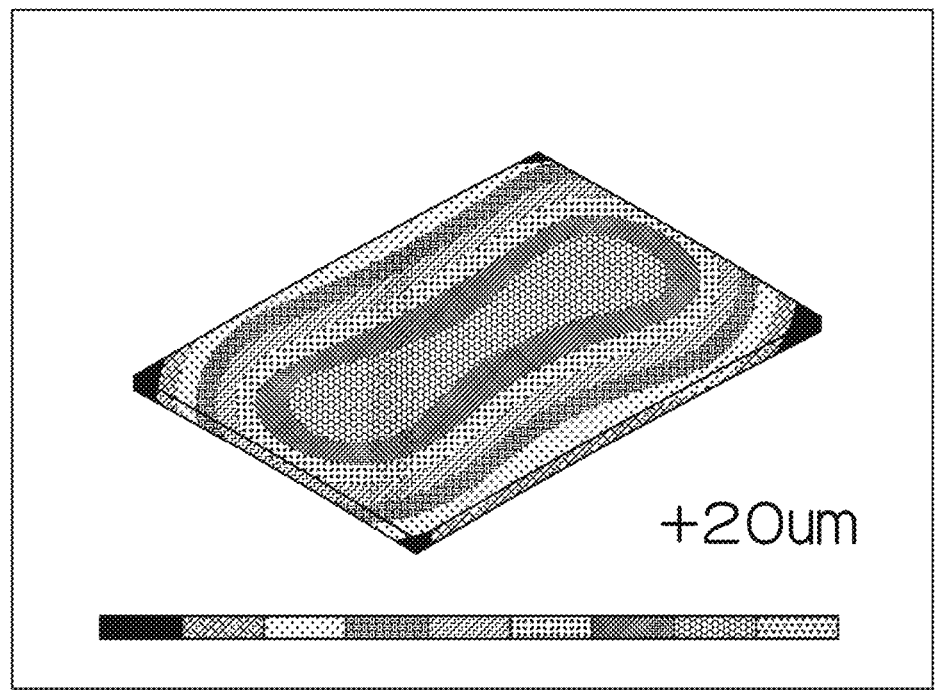
FIG. 2 is a schematic diagram illustrating the package warpage of the conventional semiconductor package.
Figure 3:
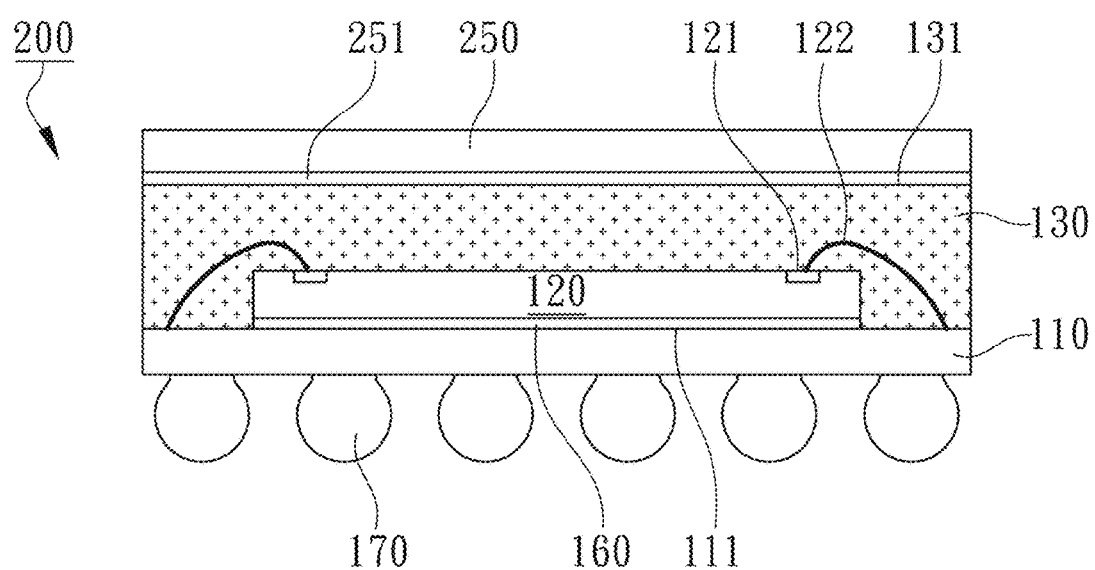
FIG. 3 is a cross sectional view diagram illustrating a conventional heat-dissipating semiconductor package.

The second encapsulation body 340 may be adhered to the heat sink 350 directly to physically couple to the heat sink. The second encapsulation body 340 may serve as a thermal stress intermediate layer between the heat sink 350 and the first encapsulation body 330, such that the heat sink 350 and the first encapsulation body 330 does not physically touch each other directly. In this way, the effect of mismatch between the thermal expansion coefficients of two materials with high Young's modulus may be reduced. The heat sink 350 is adhered to the second encapsulation body 340 and does not physically touch the first encapsulation body 330 directly. The material of the heat sink 350 may include copper or other metal. Thus, the heat sink 350 may be used to dissipate heat through heat conduction. In this embodiment, even if the size of the heat sink 350 is bigger, such as 15 cm×15 cm, the influence of the thermal stress on the first encapsulation body 330 is not evident. Because of the spacing provided by the second encapsulation body 340, the thermal expansion and contraction of the heat sink 350 does not have influence on the first encapsulation body 330. Since the Young's modulus of the first encapsulation body 330 is three times or more than three times the value of the Young's modulus of the first encapsulation body 340, the second encapsulation body 340 may absorb and accommodate the thermal stress between the first encapsulation body 330 and the heat sink 350 effectively. The second encapsulation body 340 may have a greater tolerance of elastic deflection. Thus, the interference of the thermal stress of the heat sink 350 and the heat-dissipating semiconductor package 300 may be decreased. And, the interference of the shape of the heat-dissipating semiconductor package 300 caused by the thermal expansion and contraction of the heat sink 350 is also decreased to further achieve the effect of reducing the package warpage of the heat-dissipating semiconductor package 300. Referring to FIG. 7, as an exemplary embodiment, when both the sizes of the substrate 310 and the heat sink 350 are 15 cm×15 cm, the package warpage of the heat-dissipating semiconductor package 300 is −55 μm. Compared with the heat-dissipating semiconductor package 200 in FIG. 3, in the condition that the thermal expansion coefficients of the corresponding materials are the same, the package warpage can be decreased from −89 μm to −55 μm according to the present invention.

Figure 4:
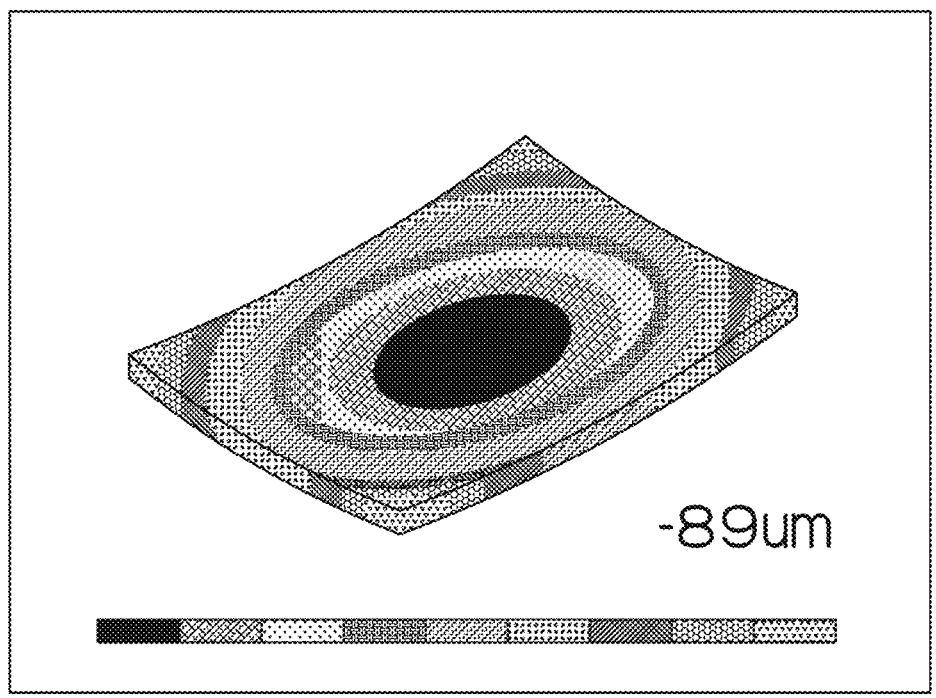
FIG. 4 is a schematic diagram illustrating the package warpage of the conventional heat-dissipating semiconductor package.
Figure 8A:
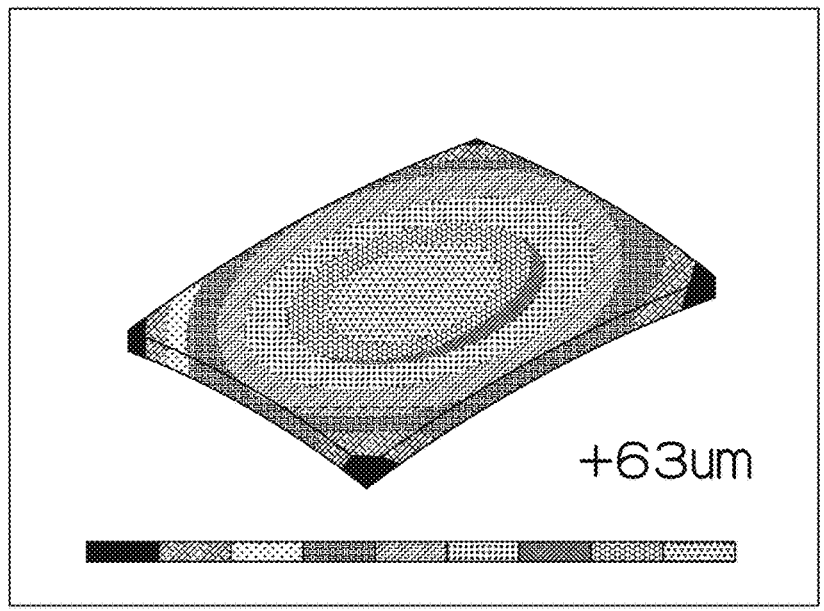
FIG. 8A is another schematic diagram illustrating the package warpage of the conventional heat-dissipating semiconductor package having the heat sink.
Figure 8B:
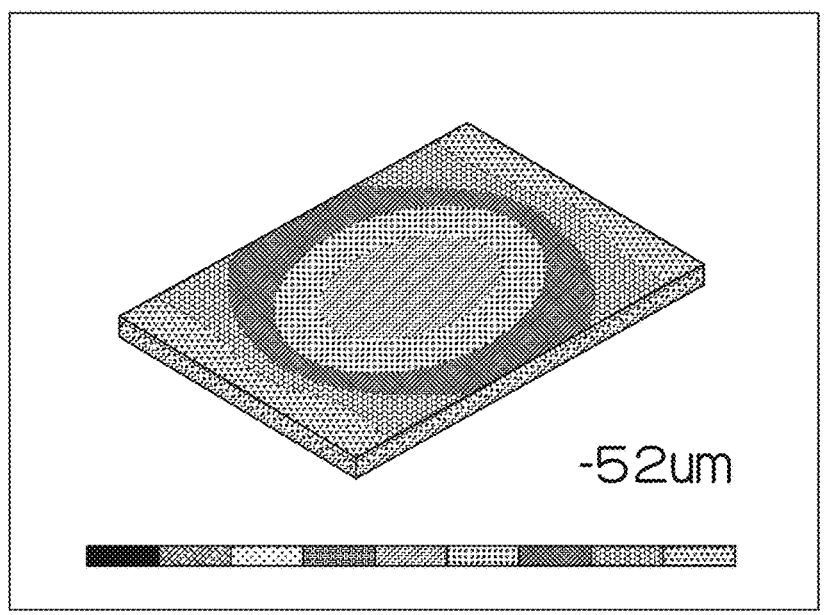
FIG. 8B is another schematic diagram illustrating the package warpage of the heat-dissipating semiconductor package according to an embodiment of the present invention.

FIG. 8A is another schematic diagram illustrating the package warpage of the conventional heat-dissipating semiconductor package having the heat sink. FIG. 8B is another schematic diagram illustrating the package warpage of the heat-dissipating semiconductor package according to an embodiment of the present invention. Specifically, referring to FIG. 8A and FIG. 3, in the condition that the thermal expansion coefficients of the package devices of the conventional heat-dissipating semiconductor package 200 are changed and the heat sink 250 is installed, a balanced package warpage may occur, and the package warpage is +63 μm. Referring to FIG. 8B and FIG. 5, in the condition that the thermal expansion coefficients of the package devices of the heat-dissipating semiconductor package 300 of the present invention are changed to the same as the aforementioned thermal expansion coefficients and the heat sink 350 is installed, another package warpage would occur, and the package warpage is −52 μm. Therefore, according to the comparison of FIG. 3, FIG. 4 and FIG. 8A, in regard to the thermal expansion coefficients of the package materials, the conventional heat-dissipating semiconductor package 200 installed with the heat sink 250 has a sensitivity of the package warpage, and the variation of the package warpage is from −89 μm to +63 μm. Therefore, along with varying and adjusting the thermal expansion coefficients of the package materials, the variation of the package warpage of the heat-dissipating semiconductor package 200 is evident. According to the comparison of FIG. 5, FIG. 7 and FIG. 8B, in the condition that the thermal expansion coefficients of the package devices of the heat-dissipating semiconductor package 300 of the present invention are adjusted to the same as the aforementioned thermal expansion coefficients, the variation of the package warpage is not evident, which varies from −55 μm to −52 μm. So, it is considered that the influence on the package warpage of the heat-dissipating semiconductor package 300 caused by the thermal expansion coefficients of the package devices is not evident.

In conclusion, the present invention can achieve the objective to reduce the effect to the package warpage caused by the mismatch of the thermal expansion coefficients of the package devices, so as to utilize the metal heat sink for increasing the efficiency of heat dissipation without resulting in serious package warpage. That is to say, the heat-dissipating semiconductor package of the present invention has the greater elasticity and tolerance range to the influence caused by the thickness or the thermal expansion coefficients of the substrate, the encapsulation bodies and the heat sink. The thermal expansion coefficients of the package materials can have a greater tolerance range, the package warpage of the heat-dissipating semiconductor package can be controlled better, and the problem of bad electrical-connection of the solder balls can be further improved.

The above description of embodiments of the present invention is intended to be illustrative but not limiting. Other embodiments of this invention will be obvious to those skilled in the art in view of the above disclosure which will still be covered by and will be within the scope of the present invention even with any modifications, equivalent variations, and adaptations. Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A heat-dissipating semiconductor package, comprising:
a substrate having an inner surface;
a chip disposed on the inner surface of the substrate;
a first encapsulation body formed on the inner surface of the substrate, the first encapsulation body encapsulating the chip and covering a portion of the inner surface of the substrate, and the first encapsulation body having a top surface and a plurality of sidewalls;
a second encapsulation body encapsulating the first encapsulation body and a periphery area of the inner surface to encapsulate the sidewalls and the top surface of the first encapsulation body and cover the periphery area of the inner surface, wherein a Young's modulus of the second encapsulation body is less than a Young's modulus of the first encapsulation body; and
a heat sink attached to the second encapsulation body.
2. The heat-dissipating semiconductor package of claim 1, wherein the Young's modulus of the second encapsulation body is less than a Young's modulus of the heat sink.
3. The heat-dissipating semiconductor package of claim 2, wherein the inner surface of the substrate is completely covered by the first encapsulation body and the second encapsulation body.
4. The heat-dissipating semiconductor package of claim 1, wherein a portion of the second encapsulation body serves as a warpage buffer layer disposed between the top surface of the first encapsulation body and the heat sink.
5. The heat-dissipating semiconductor package of claim 4, wherein a thickness of the warpage buffer layer ranges from 0.05 mm to 0.2 mm.

6. The heat-dissipating semiconductor package of claim 1, wherein the second encapsulation body is attached to the heat sink through physical contact.

7. The heat-dissipating semiconductor package of claim 1, wherein the heat sink comprises a metal material.

8. The heat-dissipating semiconductor package of claim 1, wherein the first encapsulation body comprises an epoxy molding compound (EMC) material.

9. The heat-dissipating semiconductor package of claim 1, wherein a material of the second encapsulation body comprises one of epoxy resin, silicon resin and polyimide resin.

10. The heat-dissipating semiconductor package of claim 9, wherein the material of the second encapsulation body further includes an additive of high thermal conductive material.

11. The heat-dissipating semiconductor package of claim 10, wherein the additive of high thermal conductive material comprises metal particles, metal alloy particles, or ceramic particles.

12. The heat-dissipating semiconductor package of claim 11, wherein the metal material includes aluminum, gold, or copper.

13. The heat-dissipating semiconductor package for of claim 1, further comprising a chip adhesion layer disposed between the substrate and the chip.

14. The heat-dissipating semiconductor package of claim 1, further comprising a plurality of solder balls disposed below the substrate.

15. The heat-dissipating semiconductor package of claim 1, wherein the Young's modulus of the first encapsulation body is three or more times a value of the Young's modulus of the second encapsulation body.

16. The heat-dissipating semiconductor package of claim 1, wherein the Young's modulus of the second encapsulation body ranges from 0.01 GPa to 5 GPa.

17. The heat-dissipating semiconductor package of claim 1, wherein the substrate comprises a plurality of wiring lines disposed on the inner surface, a plurality of through holes for vertical electrical-conduction, and a plurality of bonding pads disposed on an outer surface of the substrate, and the wiring lines further extend to the periphery area.

18. The heat-dissipating semiconductor package of claim 17, wherein a portion of the wiring lines are electrically connected to the corresponding bonding pads via the through holes.

19. The heat-dissipating semiconductor package of claim 1, wherein a thickness of a portion of the second encapsulation body corresponding to the sidewalls of the first encapsulation body ranges from 0.2 mm to 1.0 mm.

20. The heat-dissipating semiconductor package of claim 1, wherein a thickness of the heat sink ranges from 0.05 mm to 0.3 mm.

\* \* \* \* \*